United States Patent [19]

Wyss

[11] Patent Number: 4,535,536
[45] Date of Patent: Aug. 20, 1985

[54] METHOD OF ASSEMBLING ADAPTOR FOR AUTOMATIC TESTING EQUIPMENT

[75] Inventor: Robert P. Wyss, Manhattan Beach, Calif.

[73] Assignee: Augat Inc., Mansfield, Mass.

[21] Appl. No.: 548,422

[22] Filed: Nov. 3, 1983

[51] Int. Cl.³ ............................................. H05K 3/00
[52] U.S. Cl. ............................... 29/845; 324/73 PC; 324/158 F
[58] Field of Search ......... 29/845; 324/73 PC, 158 F, 324/158 P; 339/156 R, 18 P, 18 B, 18 C

[56] References Cited

FOREIGN PATENT DOCUMENTS

| 26824 | 4/1981 | European Pat. Off. |
| 2063198 | 6/1971 | Fed. Rep. of Germany . |
| 1800657 | 10/1974 | Fed. Rep. of Germany . |
| 2427118 | 1/1975 | Fed. Rep. of Germany . |
| 2920226 | 11/1980 | Fed. Rep. of Germany ... 324/158 F |
| 2933862 | 3/1981 | Fed. Rep. of Germany ... 324/73 PC |
| 3033717 | 3/1982 | Fed. Rep. of Germany ... 324/158 F |
| 720908 | 12/1954 | United Kingdom . |

OTHER PUBLICATIONS

IBM Tech. Discl. Bull., vol. 19, No. 1, Jun. 1976, p. 125 by J. Arnhart et al.
IBM Tech. Discl. Bull., vol. 26, No. 1, Jun. 1983, p. 218 by M. Apgar et al.

Primary Examiner—Howard N. Goldberg
Assistant Examiner—Carl J. Arbes
Attorney, Agent, or Firm—Weingarten, Schurgin, Gagnebin & Hayes

[57] ABSTRACT

An adaptor for electrically connecting an irregular array of terminals of a circuit device to be tested to a regular array of terminals of a universal test fixture for automatic testing equipment. The adaptor includes a top plate having an aperture pattern that corresponds to the terminal pattern of the circuit device, a bottom plate having an aperture pattern that corresponds to the universal test fixture, and an alignment plate intermediate the top and bottom plates having apertures so disposed as to guide rigid probes extending from individual ones of the apertures in the top plate into preselected ones of the apertures in the bottom plate. A method for fabricating the adaptor is also disclosed.

3 Claims, 6 Drawing Figures

METHOD OF ASSEMBLING ADAPTOR FOR AUTOMATIC TESTING EQUIPMENT

FIELD OF THE INVENTION

This invention is directed to the field of automatic testing equipment, and more particularly, to a novel adaptor for automatic testing equipment and method.

BACKGROUND OF THE INVENTION

Universal test fixtures for automatic testing equipment are commonly employed to removably retain an electronic circuit device in electrical communication with automatic testing equipment. The testing equipment is operative to ascertain whether the electronic circuit device conforms to a predetermined standard of quality whereby functional devices may be readily identified and separated from defective ones.

The test fixtures usually include a regular array of upstanding signal contacts. The geometry defined by the electrical terminals of the electronic circuit device to be tested and the geometry defined by the regular array of upstanding signal contacts of the test fixture, however, is often such that one or more of the electrical terminals of the circuit device are out of coaxial alignment with corresponding ones of the upstanding signal contacts of the test fixture. In such situations, an adaptor is provided for electrically connecting the circuit device to the test head.

One known adaptor includes an array of signal contacts aligned with the electrical terminals of the electronic circuit device to be tested that are individually hand-wired and soldered to preselected ones of an array of signal contacts having a geometry that corresponds to the geometry of the test fixture. However, such hand-wired adaptors are disadvantageous, among other things, due to the considerable time and labor costs involved in hand-wiring the adaptors, and due to the possibility of erroneous results produced by a failure of one or more of the soldered electrical connections.

It is also known to employ an adaptor having an upper plate having apertures provided therethrough in alignment with the electrical terminals of an electronic circuit device to be tested, a lower plate having apertures provided therethrough corresponding to the regular array of signal contacts of the test fixture, and a plurality of flexible probes manually inserted between the plates such that the heads of the flexible probes define an array of contacts in alignment with the electrical terminals of the electronic circuit device to be tested and the tails of the flexible probes define a second array of signal contacts in alignment with the regular array of upstanding signal contacts on the test fixture. This type of adaptor is disadvantageous, among other things, due to the comparatively high cost of flexible probes. Moreover, the tails of corresponding ones of the flexible probes are received in random ones of the apertures of the lower plate which necessitates that a particular adaptor configuration be "learned" by the automatic testing equipment on a known "good" device prior to testing for defective devices.

SUMMARY OF THE INVENTION

The novel adaptor for automatic testing equipment of the present invention includes a plurality of rigid probes each having head and tail portions, and contemplates a probe support assembly and method that so disposes the rigid probes that the heads of the probes define a first array of signal contacts in alignment with the electrical terminals of a particular electronic circuit device and the tails of the probes define a second array of signal contacts in alignment with predetermined ones of the upstanding signal contacts of a universal test fixture. In this manner, costly and time-consuming hand soldering, comparatively expensive flexible probes, as well as the "learning" procedure of the heretofore known adaptors are obviated.

The novel adaptor for automatic testing equipment and method of the present invention preferably includes a top plate having apertures of a pre-selected size provided therethrough in a first pattern that conforms to the pattern of the electrical terminals of a particular electronic circuit device to be tested, a bottom plate having apertures having substantially the same size provided therethrough in a second pattern that conforms to the pattern of the upstanding signal contacts of a universal test head, and an alignment plate intermediate the top and bottom plate having apertures having an enlarged size in a third pattern that conforms to the first pattern of the electrical terminals of the electronic circuit device to be tested. Individual ones of the rigid probes are slidably received in confronting adjacent apertures through the several plates. The alignment plate is so positioned intermediate the top and bottom plates that those probes that are slidably received in coaxially aligned apertures of the top and bottom plates pass freely through the corresponding enlarged apertures of the intermediate plate into corresponding ones of the aligned apertures of the lower plate, while those probes that are slidably received in non-coaxially aligned apertures of the top and bottom plates are guided by the walls defining the corresponding apertures in the alignment plate into predetermined ones of the apertures in the lower plate.

The novel method for fabricating the adaptor for automatic testing equipment according to the present invention includes the steps of spacing the top and alignment plates apart with each of the apertures of the top plate coaxially aligned with corresponding ones of the apertures of the alignment plate; inserting rigid probes through individual ones of the aligned apertures such that the head portions of each of the probes are disposed on the top plate and the tail portions thereof extend through the alignment plate; displacing the intermediate plate by a distance along a direction selected to align the tails of each of the rigid probes to be physically adjacent pre-selected ones of the apertures of the bottom plate; and controllably vibrating the alignment plate to allow the tails of each of the rigid probes to be received in the corresponding pre-selected ones of the apertures in the bottom plate. The rigid probe insertion step preferably includes the steps of placing a so-called egg crate assembly over the aligned top and alignment plates; disposing a plurality of rigid probes into the egg crate, and vibrating the egg crate and top and alignment plates in unison until such time as the probes are received in corresponding ones of the aligned apertures of the top and alignment plates.

BRIEF DESCRIPTION OF THE DRAWINGS

Other features of the present invention will become apparent as the invention becomes better understood by referring to the following detailed description of the preferred embodiment, and to the drawings, wherein.

DETAILED DESCRIPTION OF THE PREFERRED EMBODIMENTS

Figure 1:
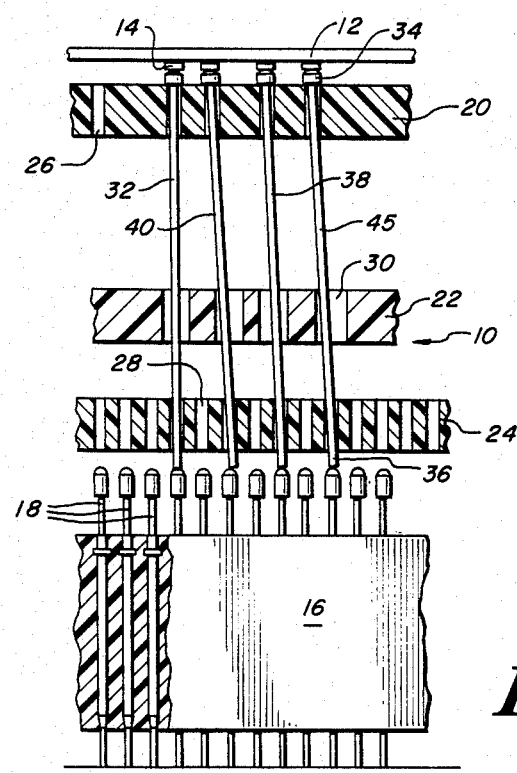
FIG. 1 is a not-to-scale sectional view illustrating an adaptor for automatic testing equipment according to the present invention.

Referring now to FIG. 1, generally designated at 10 is a not-to-scale sectional view illustrating an adaptor for automatic testing equipment according to the present invention. The adaptor 10 electrically connects an electronic circuit device to be tested such as a printed circuit board 12 having a plurality of electrical terminals 14 to a test head 16 having a regular array of upstanding signal contacts 18. Preferably, the contacts 18 are spring loaded POGO contacts. The adaptor 10 includes a top plate 20, an alignment plate 22, and a bottom plate 124 in vertically spaced relation.

The top plate 20 includes a plurality of apertures 26 therethrough, five being specifically illustrated, each of which is coaxially aligned with a corresponding one of the electrical terminals 14 of the electronic circuit device 12 to be tested. The apertures 26 generally define a 2×2 array pattern that matches the 2×2 array pattern defined by the electrical terminals 14 of a particular device 12.

The bottom plate 24 includes a plurality of apertures 28 therethrough, fourteen being specifically illustrated, each of which is coaxially aligned with a corresponding one of the upstanding signal contacts 18 of the test head 16 of the automatic testing equipment. The apertures 28 generally define a 2×2 array pattern that conforms to the 2×2 array pattern defined by the signal contacts 18 of the test head 16. The size of each of the apertures 26, 28 through the plates 20, 24 are preferably the same.

The alignment plate 22 includes a plurality of apertures 30 therethrough, four being specifically illustrated, each of which is aligned with a corresponding one of the apertures 26 of the top plate 22. The apertures 30 each have a size selected to be larger than the size of the apertures 26, 28, and generally define a 2×2 array pattern that matches the 2×2 array pattern defined by the apertures 26 of the top plate 22.

A plurality of rigid probes 32 are individually slidably received in corresponding pre-selected apertures 26, 28, 30 of the top, bottom, and alignment plates 20, 24, 22. Rigid probes are preferred although other probes, such as POGO probes can also be used. Each of the rigid probes 32 include an enlarged head portion 34 that is adapted to electrically contact corresponding ones of the electrical terminal 14 of the device 12, and a tail portion 36 that is adapted to electrically contact corresponding pre-selected ones of the corresponding signal contacts 18 of the head 16. Each of the rigid probes 32 pass through a corresponding one of the plurality of apertures 30 provided therefor in the allignment plate 22. The alignment plate 22 is so disposed intermediate the top plate 20 and the bottom plate 24 as to guide the tails 36 of the rigid probes 32 into pre-selected ones of the apertures 28 of the bottom plate 24. In the case where a probe is received in aligned ones of the apertures 26, 28, as illustrated by the rigid probe 38, the alignment plate 22 so guides the probe that it is slidably received through the coaxially aligned aperture in the bottom plate. In the case where a probe is received in non-aligned ones of the apertures 26, 28, as illustrated by the rigid probe 40, the alignment plate 22 so guides the rigid probe that it is slidably received in a preselected one of the apertures in the bottom plate. In the former case, the corresponding aperture pair of the top and bottom plates are aligned, and the rigid probes thereby pass through the aligned pairs in a generally vertical orientation; in the latter case, the corresponding aperture pairs of the top and bottom plates are not coaxially aligned, and the rigid probes are deflected by the walls of the corresponding apertures of the alignment plate out of vertical alignment such that the probes are selectively received in preselected apertures of the bottom plate.

Figure 2A:
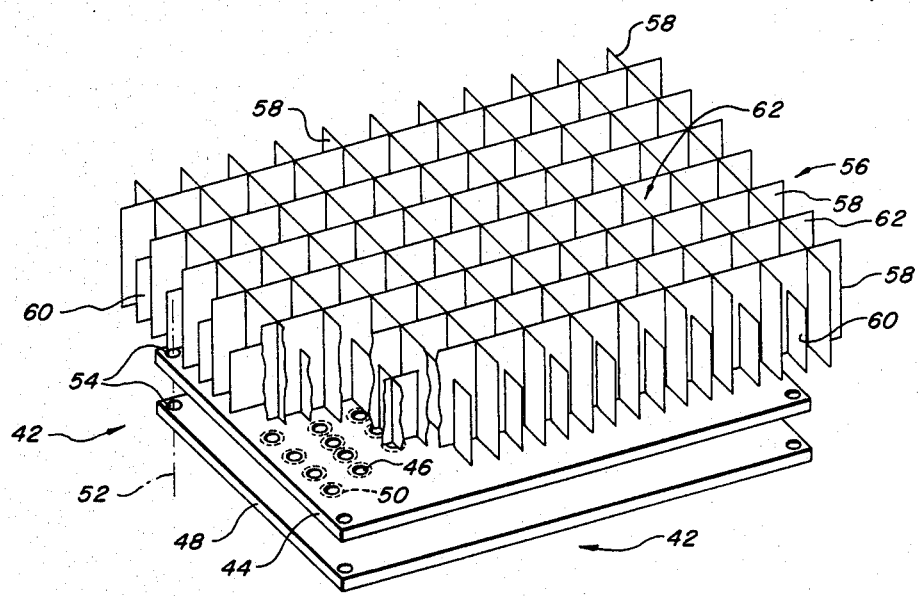
FIG. 2A is a not-to-scale exploded perspective view illustrating one step in the method of fabricating the adaptor for automatic testing equipment of the present invention.

Referring now to FIG. 2A, generally designated at 42 is an assembly of components useful in illustrating one step of the method of fabricating an adaptor for automatic testing equipment according to the present invention. The assembly 42 includes a top plate 44 having a plurality of apertures 46 therethrough in a pattern that corresponds to the pattern defined by the electrical terminals of an electronic circuit device to be tested. An alignment plate 48 is provided below the top plate 44 having a plurality of apertures 50 therethrough that are coaxially aligned with the apertures 46 of the top plate 44. The apertures 46 of the top plate 44 are sized to be slightly larger than the cross-sectional diameter of the stems 45 (FIG. 1) of the rigid probes and the apertures 50 of the alignment plate 48 are sized to be larger than the apertures 46 to allow those rigid probes that extend between non-aligned aperture pairs of the top and bottom plates to deflect from the vertical. The top plate 44 and the alignment plate 48 are held in vertically spaced relation by any suitable means with individual ones of the openings 46 coaxially aligned with confronting corresponding ones of the openings 50. Alignment posts, illustrated by the dashed line 52 are preferably passed through aligned apertures 54 provided therefor on the corners of the top plate 44 and the alignment plate 48 for alignment of the assembly.

An egg-crate generally designated 56 is positioned on the top plate 44. The egg-crate 56 includes a plurality of laterally and transversely extending spaced walls 58 and a plurality of laterally and transversely extending half-walls 60 spaced apart in the inter-spacing between the walls 58 along the width and length of the top plate 42. The walls 58 are preferably spaced apart a distance that is larger than the linear extension of the probes. The walls 58, 60 define a plurality of chambers generally designated 62 that are uniformly disposed over the top surface of the plate 44.

Figure 2B:
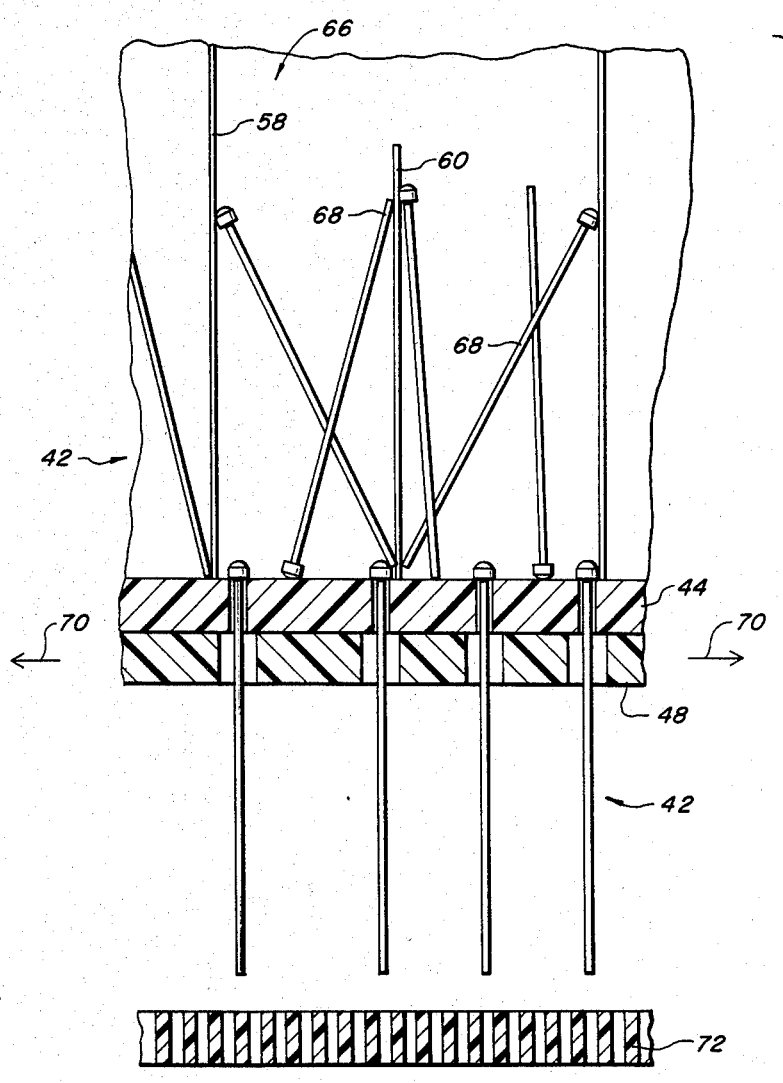
FIG. 2B is a not-to-scale sectional view illustrating another step in the method of fabricating the adaptor for automatic testing equipment of the present invention.

A plurality of rigid probes 68 are poured into each of the chambers 66 in relative random orientation as shown in FIG. 2B. The spacing of the walls 58 and the height of the half-walls 60 prevents bridging of the probes therebetween so that all probes are received in corresponding chambers 66. The assembly 42 is vibrated in the horizontal plane as illustrated by the arrows 70 until each of the probes 68 are slidably received in corresponding ones of the aligned apertures of the top and alignment plate 44, 48. The egg-crate is then removed, and the excess probes are removed from the top plate.

Figure 2C:
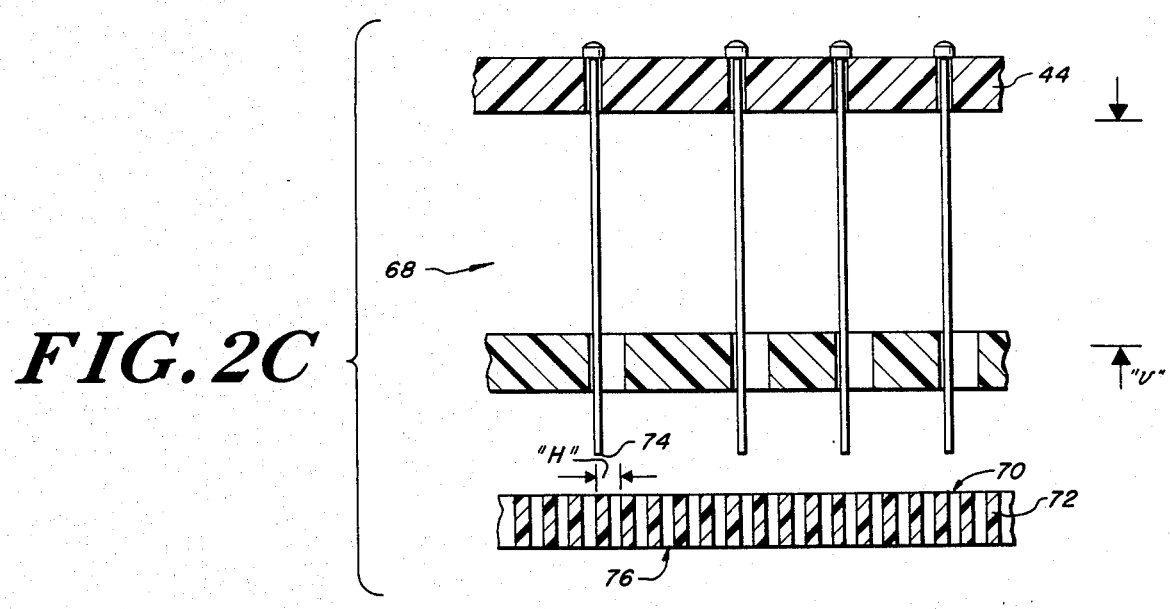
FIG. 2C is a not-to-scale sectional view illustrating another step in the method of fabricating the adaptor for automatic testing equipment according to the present invention.

Referring now to FIG. 2C, generally designated at 68 in an assembly of components useful in illustrating another step in the method of fabricating the adaptor for automatic testing equipment according to the present invention. After the probes 68 have all been slidably received in the corresponding aligned apertures of the top and alignment plates 44, 48, the alignment plate is displaced relative to the top plate in a generally downward direction by a distance "V," and is moved generally horizontally by a distance "H" and in a direction selected to bring the tails of the probes 68 in position to be received in pre-selected ones of the apertures 70 provided in a bottom plate 72. The distance "H" is selected to correspond to the difference between the outside dimension of the stems of the probes 68 and the dimension of the apertures of the alignment plate. The direction preferably is selected to be 45°. In this manner, as appears below, the tail of a rigid probe designated 74 is selectively insertable in an aperture designated 76 in the bottom plate.

Figure 2D:
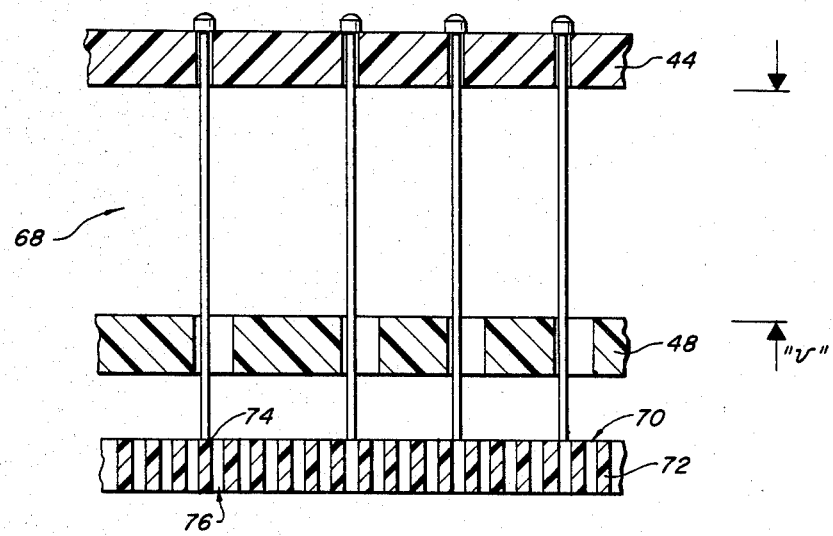
FIG. 2D is a not-to-scale sectional view illustrating still another step in the method of fabricating the adaptor for automatic testing equipment according to the present invention.
Figure 2E:
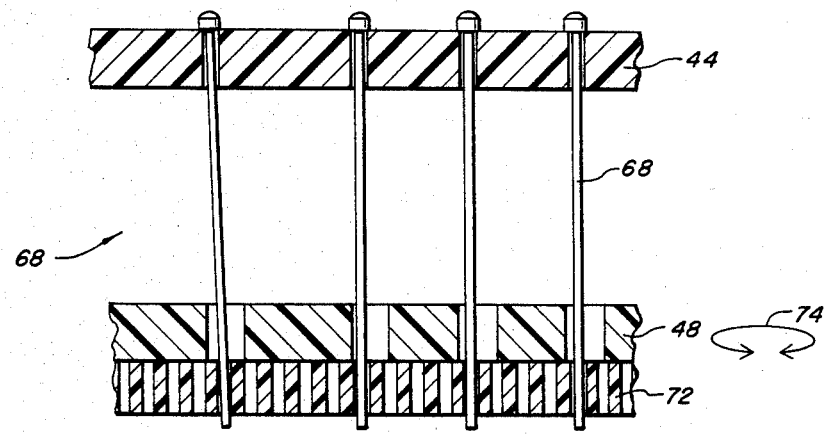
FIG. 2E is a not-to-scale sectional view illustrating another step in the method of fabricating the adapter for automatic testing equipment according to the present invention.

Referring now to FIG. 2D, the top plate 44 is lowered allowing the tails of the probes to contact the bottom plate 72. The alignment plate 48 is then vibrated for a controlled displacement in a generally circular pattern in the plane defined by the alignment plate as illustrated at 74 in FIG. 2E. The rigid probes 66 are thereby guided by the alignment plate 48 into pre-selected ones of the apertures provided therefor in the bottom plate 72. The probes slidably received in coxially aligned apertures of the top and bottom plates remain vertical, while the probes received in non-coaxially aligned apertures of the top and bottom plates are selectively guided by the intermediate plate into pre-selected apertures of the bottom plate. In this manner, the rigid probes are received in pre-determined ones of the apertures of the bottom plate in a manner not requiring hand-soldering, flexible probes, nor the testing of a known "good" board to "learn" the configuration of a particular adaptor as in the heretofore known devices.

It will be appreciated that many modifications of the presently disclosed invention will become apparent to those skilled in the art without departing from the scope of the appended claims.

What is claimed is:

1. A method for fabricating an adaptor for automatic testing equipment comprising the steps of:
    aligning a first plate having a plurality of apertures each having a first size and arrayed in a first pattern that conforms to the pattern of an electronic circuit device to be tested with a second plate having a plurality of apertures each having a second size larger than the first size and arrayed in a second pattern that corresponds to the pattern of the terminals of the electronic circuit device to be tested such that confronting ones of the apertures of the first and second plate are coaxially aligned;
    disposing a plurality of rigid probes each having tail portions through respective ones of said confronting aligned apertures in the first and second plates;
    displacing the second plate a selected distance in a selected direction in the plane defined by the plane of the second plate;
    positioning a third plate having apertures arrayed in a third pattern that conforms to the pattern of the signal contacts of a universal test fixture proximate the tails of the rigid probes; and
    vibrating the second plate controlably in the plane defined by the second plate such that corresponding ones of the tails are received in preselected ones of the apertures of the third plate.

2. The invention of claim 1, further including the step of displacing the second plate away from the first plate prior to said displacing in said plane step.

3. The invention of claim 1, wherein said disposing step includes the steps of positioning an egg-crate defining a plurality of chambers over said first plate; pouring a plurality of rigid probes into said chambers and controllably vibrating the first and second plates until said probes are slidably received in respective ones of said aligned apertures.

* * * * *